(12) United States Patent
Kim et al.

(10) Patent No.: US 10,182,503 B2
(45) Date of Patent: Jan. 15, 2019

(54) ELECTRONIC DEVICE

(71) Applicant: Samsung Display Co., Ltd., Yongin-Si, Gyeonggi-Do (KR)

(72) Inventors: Dong-ho Kim, Seoul (KR); Minsoo Kim, Seoul (KR); Kyubong Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/861,520

(22) Filed: Jan. 3, 2018

(65) Prior Publication Data

US 2018/0235091 A1    Aug. 16, 2018

(30) Foreign Application Priority Data

Feb. 10, 2017    (KR) .................. 10-2017-0018862

(51) Int. Cl.
| | |
|---|---|
| *H05K 5/00* | (2006.01) |
| *G06F 3/041* | (2006.01) |
| *H05K 5/03* | (2006.01) |

(52) U.S. Cl.
CPC ......... *H05K 5/0017* (2013.01); *G06F 3/0412* (2013.01); *H05K 5/0086* (2013.01); *H05K 5/03* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,415,570 | B2* | 4/2013 | Dabov | G06F 1/1656 174/520 |
| 8,582,282 | B2 | 11/2013 | Kim et al. | |
| 8,614,881 | B2* | 12/2013 | Yoo | G04G 21/00 345/169 |
| 8,866,703 | B2* | 10/2014 | Weiss | G06F 3/03545 345/183 |
| 9,794,397 | B2* | 10/2017 | Min | G04G 21/04 |
| 9,805,214 | B2* | 10/2017 | Sahu | H04W 12/02 |

(Continued)

FOREIGN PATENT DOCUMENTS

| | | |
|---|---|---|
| JP | 2012-222215 A | 11/2012 |
| JP | 5586541 B2 | 9/2014 |

(Continued)

*Primary Examiner* — Lisa Lea Edmonds
(74) *Attorney, Agent, or Firm* — Lewis Roca Rothgerber Christie LLP

(57) ABSTRACT

An electronic device may include a window member, a display member, a first coupling member, and a second coupling member. The window member may have a dome shape which is convex in a first direction, and may include an outer surface including a curved surface, an inner surface including a curved surface and facing the outer surface, and a connecting surface connecting the inner surface and the outer surface. The display member may display an image toward the inner surface and may include a curved surface. The first coupling member may be disposed between the window member and the display member to cover at least a portion of the inner surface and to couple the display member to the window member. The second coupling member may be disposed to cover an edge of the display member and couple the display member to the window member.

18 Claims, 8 Drawing Sheets

(56) References Cited

U.S. PATENT DOCUMENTS

| | | | |
|---|---|---|---|
| 9,846,507 B2* | 12/2017 | Heo | G06F 3/0416 |
| 9,874,901 B2* | 1/2018 | Seok | A61B 5/681 |
| 9,886,059 B2* | 2/2018 | Seok | A61B 5/681 |
| 9,937,793 B2* | 4/2018 | Herrera-Morales | B60K 35/00 |
| 9,953,312 B2* | 4/2018 | Lee | G09G 5/12 |
| 10,025,275 B2* | 7/2018 | Kim | G09G 3/3648 |
| 2015/0022999 A1* | 1/2015 | Yu | F21K 9/90 |
| | | | 362/84 |
| 2016/0034042 A1* | 2/2016 | Joo | G02B 27/0172 |
| | | | 345/633 |
| 2016/0073073 A1* | 3/2016 | Ha | H04B 1/3888 |
| | | | 345/156 |
| 2016/0084994 A1 | 3/2016 | Namkung | |
| 2016/0107029 A1* | 4/2016 | Kim | A61B 5/6895 |
| | | | 482/8 |
| 2016/0127851 A1* | 5/2016 | Baek | H04W 4/70 |
| | | | 370/328 |
| 2016/0171289 A1* | 6/2016 | Lee | G06F 3/14 |
| | | | 382/118 |
| 2016/0239142 A1* | 8/2016 | Kim | G06F 3/0416 |
| 2016/0252980 A1* | 9/2016 | Park | G06F 3/0362 |
| | | | 345/184 |
| 2016/0313809 A1* | 10/2016 | Geum | G06F 1/163 |
| 2016/0357154 A1* | 12/2016 | Shim | G06F 3/0346 |
| 2017/0108960 A1 | 4/2017 | Lee et al. | |
| 2017/0269792 A1* | 9/2017 | Xu | G06F 3/0488 |
| 2017/0301314 A1* | 10/2017 | Kim | G09G 5/14 |
| 2017/0357215 A1* | 12/2017 | Shim | G06F 3/0346 |
| 2018/0059809 A1* | 3/2018 | McClendon | G06F 3/0346 |
| 2018/0063981 A1* | 3/2018 | Park | H05K 5/069 |
| 2018/0090975 A1* | 3/2018 | Lee | H01Q 1/273 |
| 2018/0097925 A1* | 4/2018 | Ryu | G04G 9/0064 |
| 2018/0160925 A1* | 6/2018 | Kim | A61B 5/6895 |
| 2018/0173279 A1* | 6/2018 | Park | G06F 1/1656 |

FOREIGN PATENT DOCUMENTS

| | | |
|---|---|---|
| KR | 10-2015-0108259 A | 9/2015 |
| KR | 10-2016-0036169 A | 4/2016 |
| KR | 10-2016-0071273 A | 6/2016 |
| KR | 10-1681327 B1 | 11/2016 |

\* cited by examiner

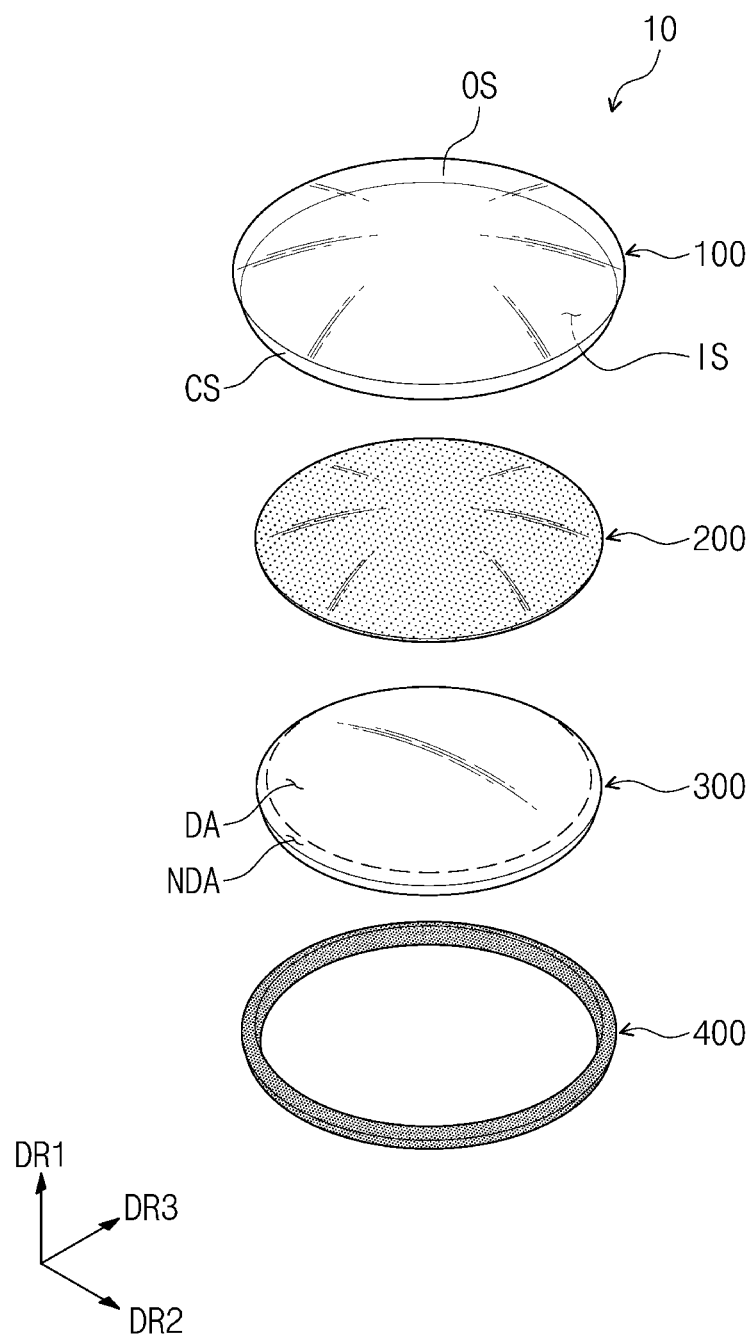

ELECTRONIC DEVICE

CROSS-REFERENCE TO RELATED APPLICATION

This application claims priority to and the benefit of Korean Patent Application No. 10-2017-0018862, filed on Feb. 10, 2017 in the Korean Intellectual Property Office, the entire content of which is hereby incorporated by reference.

BACKGROUND

1. Field

Aspects of embodiments of the present disclosure relate to an electronic device.

2. Description of the Related Art

An electronic device is activated by an electrical signal and includes a display module or a touch module. Recently, to meet various needs of users, the electronic device is provided in various forms. The electronic device is configured to include a plurality of layers for realizing various functions or to have a multi-layered structure. The layers constituting the electronic device are coupled to each other, while maintaining a shape corresponding to that of the electronic device.

SUMMARY

According to an aspect of one or more embodiments of the present inventive concept, an electronic device has improved reliability and durability.

According to some embodiments of the present inventive concept, an electronic device may include a window member, a display member, a first coupling member, and a second coupling member. The window member may have a dome shape which is convex in a first direction, and may include an outer surface including a curved surface, an inner surface including a curved surface and facing the outer surface, and a connecting surface connecting the inner surface and the outer surface. The display member may be configured to display an image toward the inner surface and may include a curved surface. The first coupling member may be arranged between the window member and the display member to cover at least a portion of the inner surface and to couple the display member to the window member. The second coupling member may be arranged to cover an edge of the display member and couple the display member to the window member.

In some embodiments, when viewed in a plan view parallel to second and third directions, the window member may have a circular shape. Here, the first, second, and third directions may be directions crossing each other.

In some embodiments, the connecting surface may have a ring shape, when viewed in the plan view.

In some embodiments, the second coupling member may be arranged to cover at least a portion of the inner surface.

In some embodiments, the second coupling member may be arranged to cover the edge of the display member and an edge of the first coupling member.

In some embodiments, the edge of the first coupling member and the edge of the display member may be aligned with each other in a thickness direction.

In some embodiments, the edge of the first coupling member and the edge of the display member may be arranged to form a stepwise structure in a thickness direction, and the second coupling member may be arranged to cover the stepwise structure.

In some embodiments, a portion of the inner surface may be covered with the first coupling member, and another portion of the inner surface may be covered with the second coupling member.

In some embodiments, the second coupling member may have a closed-loop shape, when viewed in a plan view perpendicular to the first direction.

In some embodiments, the second coupling member may include a plurality of portions which are arranged along the edge of the display member and are spaced apart from each other, when viewed in a plan view perpendicular to the first direction.

In some embodiments, the second coupling member may include at least one of acrylic or silicone resins.

In some embodiments, the second coupling member may be arranged to cover the connecting surface of the window member.

In some embodiments, the electronic device may further include a third coupling member arranged to enclose an edge of the second coupling member.

In some embodiments, the second coupling member may include an adhesive resin, and the third coupling member may include an adhesive film.

In some embodiments, the display member may include a display panel including a plurality of pixels, a touch panel on the display panel, and an optical panel on the display panel. The second coupling member may be arranged to cover an edge of the display panel, an edge of the touch panel, and an edge of the optical panel.

In some embodiments, the window member may include an upper portion and a side portion protruding from the upper portion. The upper portion and the side portion may be connected to define an internal space, and the first coupling member, the display member, and the second coupling member may be arranged in the internal space. The side portion may be arranged to enclose an edge of the second coupling member.

BRIEF DESCRIPTION OF THE DRAWINGS

Example embodiments will be more clearly understood from the following brief description taken in conjunction with the accompanying drawings. The accompanying drawings represent some non-limiting, example embodiments as described herein.

FIG. 2A is an exploded perspective view illustrating an electronic device according to some embodiments of the inventive concept.

It is to be understood that these figures are intended to illustrate the general characteristics of methods, structures, and/or materials utilized in certain example embodiments and to supplement the written description provided below. These drawings, however, may not be to scale and may not precisely reflect the precise structural or performance characteristics of any given embodiment, and should not be interpreted as defining or limiting the range of values or properties encompassed by example embodiments. For example, the relative thicknesses and positioning of components, layers, regions, and/or structural elements may be reduced or exaggerated for clarity. The use of similar or same reference numbers in the various drawings is intended to indicate the presence of a similar or same element or feature.

DETAILED DESCRIPTION

Some example embodiments of the present inventive concepts will now be described more fully with reference to the accompanying drawings, in which some example embodiments are shown.

Figure 1:
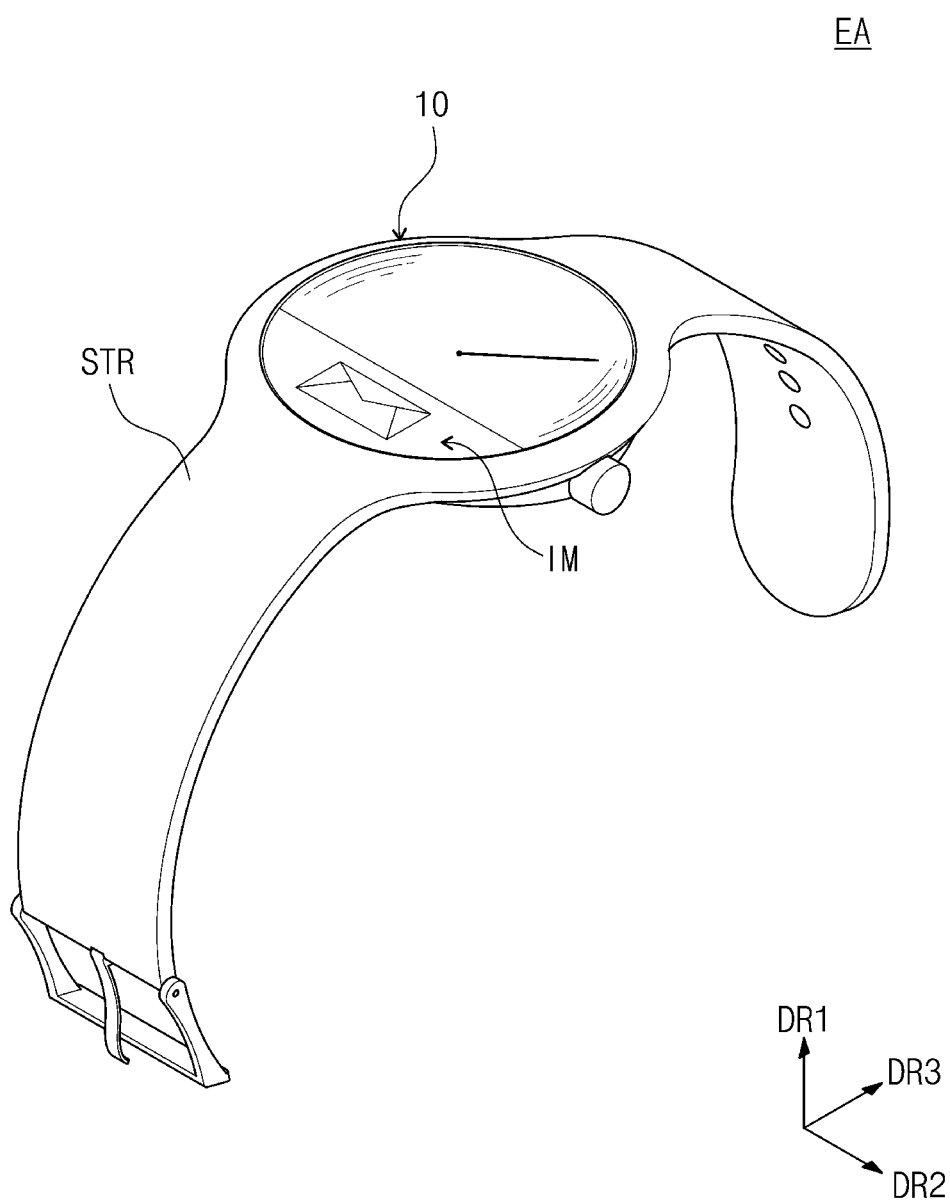
FIG. 1 is a perspective view illustrating an electronic device according to some embodiments of the inventive concept.
Figure 2B:
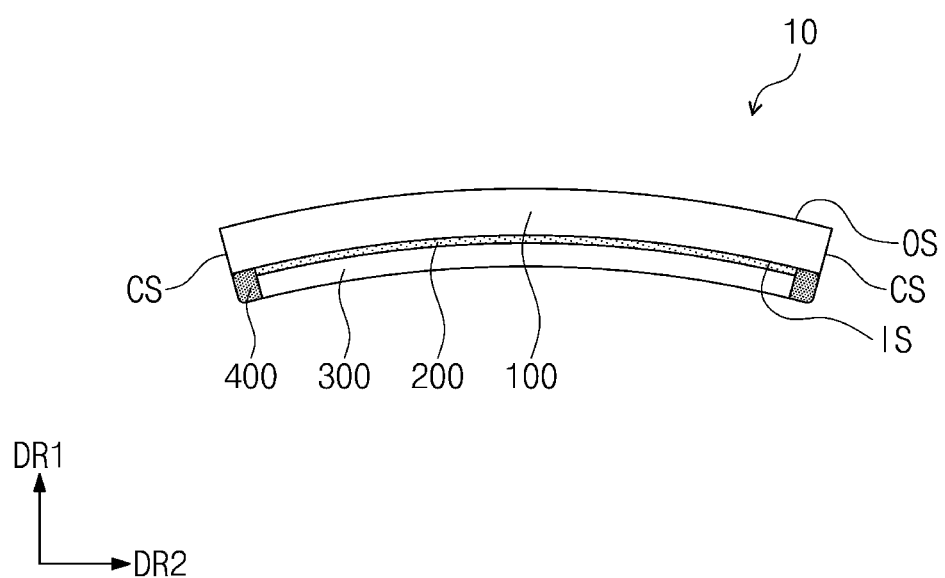
FIG. 2B is a cross-sectional view illustrating an electronic device according to some embodiments of the inventive concept.

FIG. 1 is a perspective view illustrating an electronic device according to some embodiments of the inventive concept. FIG. 2A is an exploded perspective view illustrating an electronic device according to some embodiments of the inventive concept. FIG. 2B is a cross-sectional view illustrating an electronic device according to some embodiments of the inventive concept. Herein, an electronic device according to some embodiments of the inventive concept will be described with reference to FIGS. 1, 2A, and 2B.

Referring to FIG. 1, an electronic device module EA may be an electronic clock. However, the inventive concept is not limited thereto, and, for example, the electronic device may be any of various electronic devices (e.g., cellular phones, tablets, monitors, head-mounted display devices, and television sets) having an image displaying function, in addition to the electronic clock.

In some embodiments, the electronic device module EA may include an electronic device 10 and a strap STR. The electronic device module EA may be configured to display an image IM, in which specific information is contained, in a first direction DR1. In the present specification, the first direction DR1 may be referred to as a vertical or thickness direction. For example, the image IM may be displayed to show a conventional analog clock image having a clock needle indicating the current time, or an icon or an execution image of an application program executed by an application processor (not shown).

The electronic device 10 may be coupled to the strap STR in a detachable manner. The electronic device 10 may be worn on a user's wrist using the strap STR. However, the strap STR may be used for various other purposes, in addition to the wrist wearing purpose. The structure of the strap STR may be variously changed, such as to allow the electronic device 10 to be worn on a user's arm or neck, for example, and in certain embodiments, the strap STR may be replaced with a cradle for disposing the electronic device 10 on another electronic device.

In certain embodiments, the strap STR may be omitted from the electronic device module EA. In this case, the electronic device module EA may be the electronic device 10. The inventive concept is not limited to a specific structure of the electronic device, and the electronic device may be provided in any of various forms.

As shown in FIGS. 2A and 2B, the electronic device 10 may include a window member 100, a first coupling member 200, a display member 300, and a second coupling member 400. The second coupling member 400, the display member 300, the first coupling member 200, and the window member 100 may be arranged in the first direction DR1.

The window member 100 may be formed of or include a transparent material. For example, the window member 100 may be formed of glass or a transparent polymer material.

When viewed in a plan view, the window member 100 may have a circular, elliptical, or polygonal shape. The window member 100 may have a convex shape, when viewed in a cross-sectional view taken parallel to the first direction DR1.

The window member 100 may include an outer surface OS, an inner surface IS, and a connecting surface CS. The window member 100 may have a dome shape. The dome shape of the window member 100 may be defined by the outer surface OS, the inner surface IS, and the connecting surface CS.

The outer surface OS may include a first curved surface. The first curved surface may be a curved surface that is convex in the first direction DR1. The first curved surface may be a spherical, semi-spherical, or aspherical surface.

The outer surface OS may have a circular or elliptical shape, when viewed in a plan view parallel to both of second and third directions DR2 and DR3. The outer surface OS may have a curved shape, when viewed in cross-sectional views parallel to the first and second directions DR1 and DR2 or parallel to the first and third directions DR1 and DR3. The outer surface OS may have a convex shape in the first direction DR1, when viewed in any cross-sectional view parallel to the first direction DR1.

The inner surface IS may be opposite to the outer surface OS. The inner surface IS may include a second curved surface. The second curved surface may be a curved surface that is convex in the first direction DR1. The second curved surface may be a spherical, semi-spherical, or aspherical surface.

The inner surface IS may have a circular or elliptical shape, when viewed in a plan view parallel to both of second and third directions DR2 and DR3. The inner surface IS may have a curved shape, when viewed in cross-sectional views parallel to the first and second directions DR1 and DR2 or parallel to the first and third directions DR1 and DR3. The inner surface IS may have a convex shape in the first direction DR1, when viewed in any cross-sectional view parallel to the first direction DR1.

The shapes of the inner and outer surfaces IS and OS may be the same or different from each other. For example, in the case in which the inner and outer surfaces IS and OS have the same shape, the window member 100 may have a dome shape and may have a uniform thickness. In the case in which the inner and outer surfaces IS and OS have different shapes from each other, the window member 100 may have a dome shape but may have a non-uniform thickness.

In the present embodiment, since the window member 100 has the dome shape, components coupled to the window member 100 may be coupled to the inner surface IS including the second curved surface. Thus, the components coupled to the window member 100 may be attached to the inner surface IS to have a surface corresponding to the second curved surface. This will be described in more detail below.

The connecting surface CS may connect the inner surface IS to the outer surface OS. The connecting surface CS may define an edge of the window member 100. Furthermore, the connecting surface CS may define an outer thickness of the window member 100.

When viewed in a cross-sectional view, the connecting surface CS may have a line shape extending in the first direction DR1 or in a direction crossing the first direction in a cross-sectional view. The connecting surface CS may have a closed-loop shape, when viewed in a plan view. The closed-loop shape may be a ring shape.

The first coupling member 200 may be disposed on the inner surface IS. The first coupling member 200 may be disposed to cover at least a portion of the inner surface IS. The first coupling member 200 may be disposed to be in close contact with the inner surface IS and may have a curved surface corresponding to the second curved surface.

The first coupling member 200 may have an adhesive property. The first coupling member 200 may be used to couple components, which are located below the first coupling member 200, to the window member 100.

For example, the first coupling member 200 may be formed of or include an optically clear adhesive (OCA), optically clear resin (OCR), or pressure sensitive adhesive (PSA) layer. Furthermore, the first coupling member 200 may be optically transparent. Accordingly, it may be possible to suppress or prevent the visibility of an image which is emitted from the display member 300 coupled with the first coupling member 200 from being deteriorated by the first coupling member 200.

The display member 300 may be configured to produce or display the image IM. The display member 300 may include an active region DA and a peripheral region NDA, when viewed in a plan view that is defined by two different directions (e.g., the second and third directions DR2 and DR3).

The active region DA may be selectively activated by an electrical signal. In the present embodiment, the active region DA may be a region that is used to display the image IM. That is, the active region DA of the display member 300 may be used to display the image IM containing information to be provided to a user.

Any of various devices can be used as the display member 300 as long as the device is configured to display the image IM. For example, any of an organic light emitting display panel, a liquid crystal display panel, an electrophoresis display panel, and so forth, may be used as the display member 300.

In some embodiments, the active region DA may be used to sense an input exerted from the outside, when it is activated by an electrical signal. In other words, the display member 300 may be used to display the image IM and may also be used as a touch sensing unit for sensing a touch event from the outside. Here, the touch event may be provided in the form of any of contact, hovering, and pressure.

The display member 300 may include a curved surface. The display member 300 may include a top surface in contact with the first coupling member 200, a bottom surface opposite to the top surface, and a side surface connecting the top and bottom surfaces and defining a thickness of the display member 300.

The display member 300 may have a dome shape that is convex in the first direction DR1. Accordingly, each of the top and bottom surfaces of the display member 300 may include a curved surface that is convex in the first direction DR1.

A shape of the display member 300 may be the same as or different from that of the window member 100. The dome shape of the display member 300 may be changed, depending on the inner surface IS of the window member 100, a thickness or viscosity of the first coupling member 200, or a thickness of the display member 300.

Accordingly, the active region DA may include a curved surface corresponding to the second curved surface. An image displayed on the active region DA may be displayed in the form of the first curved surface or the second curved surface. Alternatively, in a case in which a touch region is activated on the active region DA, the touch region may be defined in the form of the first curved surface or the second curved surface.

The display member 300 may be closely attached to the inner surface IS by the first coupling member 200. Even when the inner surface IS has a curved shape, the display member 300 may be easily coupled to the inner surface IS by the first coupling member 200.

The second coupling member 400 may be provided along edges of the first coupling member 200 and the display member 300. The second coupling member 400 may be provided to cover the edges of the first coupling member 200 and the display member 300.

In the present embodiment, an edge of a component may refer to the outermost end or side surface of the component. An edge of a component may be a surface whose height is given by a thickness of the component.

For example, in the case in which the first coupling member 200 includes a top surface, a bottom surface, and a side surface connecting the top and bottom surfaces, an edge of the first coupling member 200 may be the side surface of the first coupling member 200. In the case in which the display member 300 includes a top surface, a bottom surface, and a side surface connecting the top and bottom surfaces, an edge of the display member 300 may be the side surface of the display member 300. Thus, the edges of the first coupling member 200 and the display member 300 may be covered with the second coupling member 400 and may not be exposed to the outside.

The second coupling member 400 may be in contact with at least a portion of the window member 100. In the present embodiment, the second coupling member 400 may be in contact with the inner surface IS. Accordingly, a portion of the inner surface IS may be covered with the first coupling member 200, and another portion of the inner surface IS may be covered with the second coupling member 400.

The second coupling member 400 may be provided to have a thickness that is larger than at least a thickness of the display member 300 in the first direction DR1. The second coupling member 400 may have a thickness that is relatively larger than that of the first coupling member 200.

The second coupling member 400 may have an adhesive property. The second coupling member 400 may be used to couple the window member 100, the first coupling member 200, and the display member 300 to each other. For example, the second coupling member 400 may include at least one of acrylic or silicone resins.

In some embodiments, the second coupling member 400 may be formed by dispensing a liquid or viscous resin, which is in a sol/gel state, on the edge of the display member 300. However, the inventive concept is not limited thereto, and the second coupling member 400 may be formed by any of various other methods.

Since the electronic device 10 further includes the second coupling member 400, it may be possible to improve adhesion characteristics between the display member 300 and the window member 100. Even when the inner surface IS has a curved shape, the display member 300 may be more stably attached to the inner surface IS by the first coupling member 200 and the second coupling member 400. For example, it may be possible to suppress or prevent problems, such as a gap or wrinkle, from occurring when a component is attached to the curved surface.

In addition, the second coupling member 400 may be provided along the edge of each of the first coupling member 200 and the display member 300, thereby improving adhesion characteristics between the first coupling member 200 and the display member 300 at their edges. Accordingly, an interlayer delamination issue, which may occur at the edge of each of the window member 100, the first coupling member 200, and the display member 300, may be suppressed or prevented. Furthermore, it may be possible to suppress or prevent external contaminants from infiltrating into each of the window member 100, the first coupling member 200, and the display member 300 through the edge thereof, and thereby to stably protect the electronic device 10 from the external contaminants.

Figure 3A:
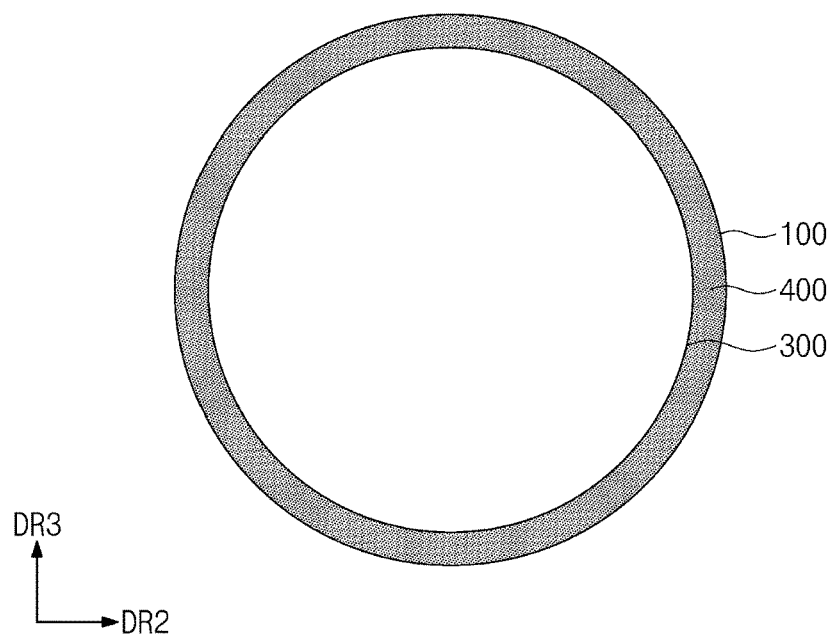
FIGS. 3A to 3C are plan views illustrating some components of an electronic device module according to some embodiments of the inventive concept.
Figure 3B:
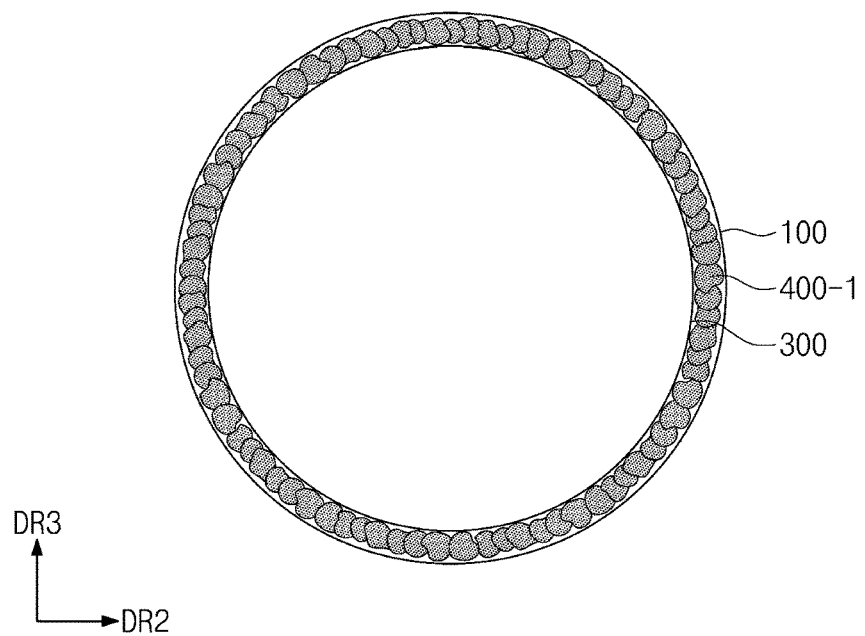
Figure 3C:
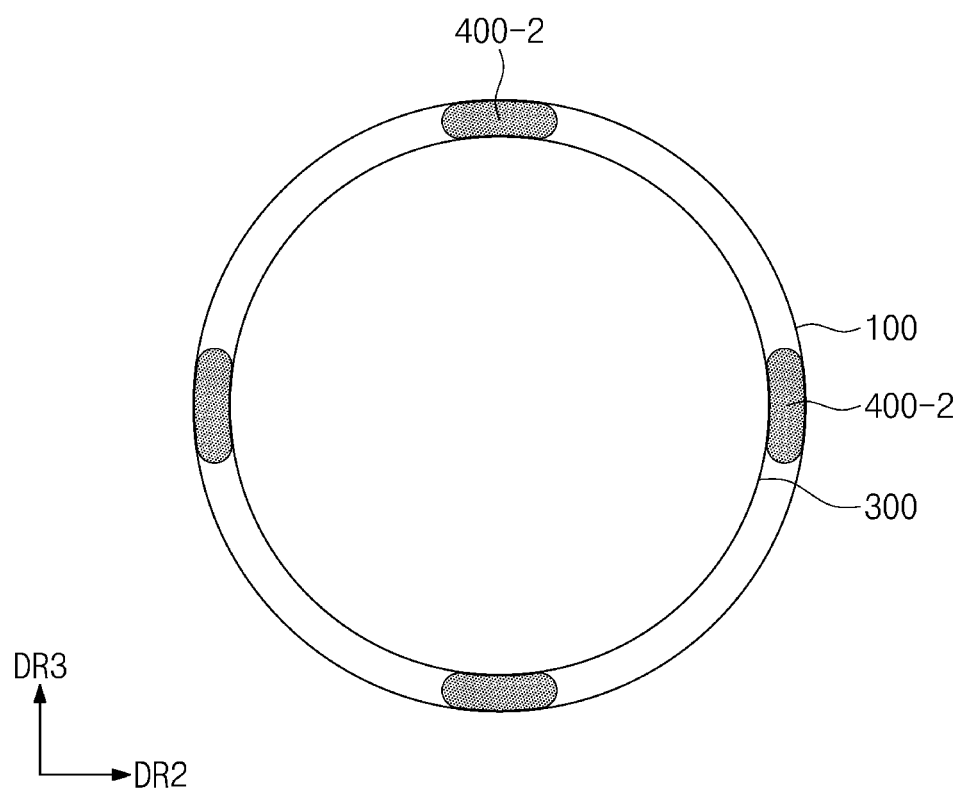

FIGS. 3A to 3C are plan views illustrating some components of an electronic device module according to some embodiments of the inventive concept. Second coupling members 400, 400-1, and 400-2 according to some embodiments of the inventive concept will be described with reference to FIGS. 3A to 3C. As shown in FIGS. 3A to 3C, the second coupling member may have any of various shapes.

As shown in FIG. 3A, the second coupling member 400 may have a closed-loop shape, when viewed in a plan view. For example, the second coupling member 400 may have a ring shape. The second coupling member 400 may be provided along the edge of the window member 100 to enclose the edge of the display member 300.

As shown in FIG. 3B, the second coupling member 400-1 may include a plurality of portions that are connected to each other. The plurality of portions may be arranged to enclose the edge of the display member 300. The plurality of portions may be connected to be in contact with each other, thereby forming a single closed-loop structure.

As shown in FIG. 3C, the second coupling member 400-2 may include a plurality of portions that are spaced apart from each other. The second coupling member 400-2 may be provided to partially cover the edge of the display member 300. For example, the second coupling member 400-2 may be selectively provided at regions having a relatively high risk of delamination, and thus make it possible to reduce a fabrication cost required to fabricate an electronic device.

However, the inventive concept is not limited to the above examples. For example, the second coupling member may have any of various shapes and may be arranged in any of various manners. That is, as long as the second coupling member contributes to improve adhesion characteristics between the window member 100 and the display member 300, the second coupling member may be freely varied in terms of the shape and arrangement.

Figure 4A:
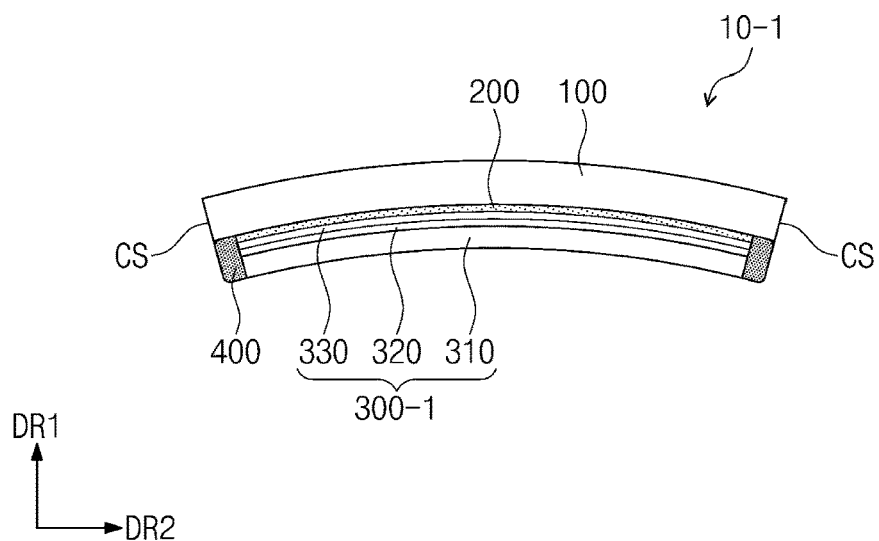
FIGS. 4A and 4B are cross-sectional views illustrating electronic device modules according to some embodiments of the inventive concept.
Figure 4B:
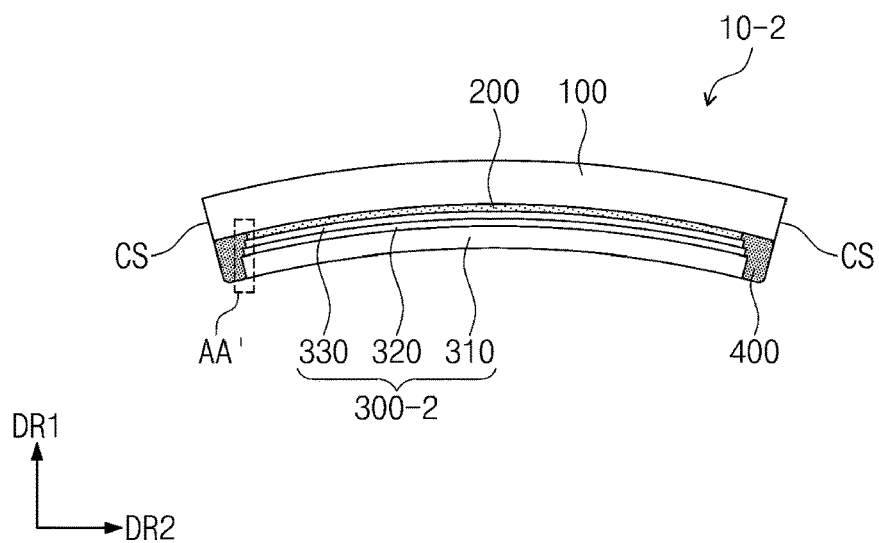

FIGS. 4A and 4B are cross-sectional views illustrating electronic device modules according to some embodiments of the inventive concept. Electronic device modules 10-1 and 10-2 will be described with reference to FIGS. 4A and 4B. For concise description, an element previously described with reference to FIGS. 1, 2A, 2B, 3A, 3B, and 3C may be identified by a similar or same reference number without repeating an overlapping description thereof.

As shown in FIG. 4A, an electronic device 10-1 may include a display member 300-1 including a plurality of layers. For example, the display member 300-1 may include a display panel 310, a touch panel 320, and an optical panel 330.

The display panel 310 may include a plurality of pixels for realizing an image. The display panel 310 may substantially correspond to the display member 300 shown in FIGS. 2A and 2B. For the sake of brevity, the elements and features of this example that are similar to those previously shown and described will not be described in further detail.

The touch panel 320 may be provided on the display panel 310. The touch panel 320 may include a plurality of sensors for sensing a touch event exerted from the outside. The touch panel 320 may be in direct contact with the display panel 310. Although not shown, an adhesive layer may be further provided between the touch panel 320 and the display panel 310. In some embodiments, the adhesive layer may be provided to have substantially the same or similar material and shape as those of the first coupling member 200.

The optical panel 330 may be provided on the display panel 310. The optical panel 330 may be configured to provide polarization, reflection, and/or antifouling functions. In the present embodiment, the optical panel 330 is illustrated to be provided on the touch panel 320; however, a stacking order of the touch panel 320 and the optical panel 330 may be changed. Furthermore, although not shown, an adhesive layer may be further provided between the optical panel 330 and the touch panel 320.

The second coupling member 400 may be provided to cover an edge of the display member 300-1 and an edge region of the first coupling member 200. Thus, the second coupling member 400 may have a thickness that is substantially equal to or larger than a sum of thicknesses of the first coupling member 200, the display panel 310, the touch panel 320, and the optical panel 330.

Since the second coupling member 400 is provided to cover an edge of each of layers constituting the display member 300-1, it may be possible to improve an interlayer delamination issue, which may occur in the display member 300-1. Accordingly, the display member 300-1 may be stably attached to the inner surface IS, even if the inner surface IS has a curved shape and the display member 300-1 includes a plurality of layers.

As shown in FIG. 4B, an electronic device 10-2 according to some embodiments may include a display member 300-2 having a stepwise edge. As shown in a region AA' of FIG. 4B, edges of the display panel 310, the touch panel 320, and the optical panel 330 of the display member 300-2 may be provided to form a stepwise shape in the first direction DR1. Accordingly, the edge of the display member 300-2 may define a non-uniform surface in the first direction DR1.

The second coupling member 400 may be provided to cover the edge of the display member 300-2, and the non-uniform surface may be covered with the second coupling member 400. Since the stepwise portions are covered with the second coupling member 400, it may be possible to effectively suppress an interlayer delamination issue, which may occur in the display member 300-2 when the stepwise portions are formed.

Figure 5A:
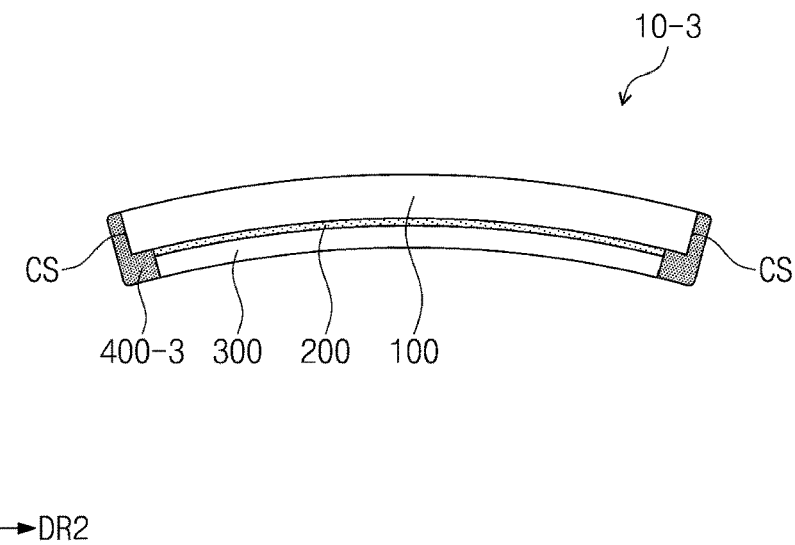
FIGS. 5A to 5C are cross-sectional views illustrating electronic device modules according to some embodiments of the inventive concept.
Figure 5B:
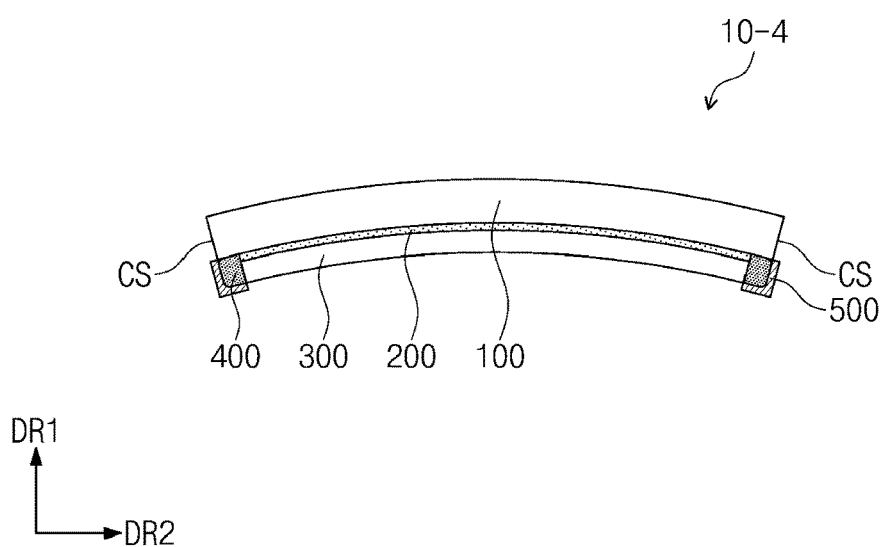
Figure 5C:
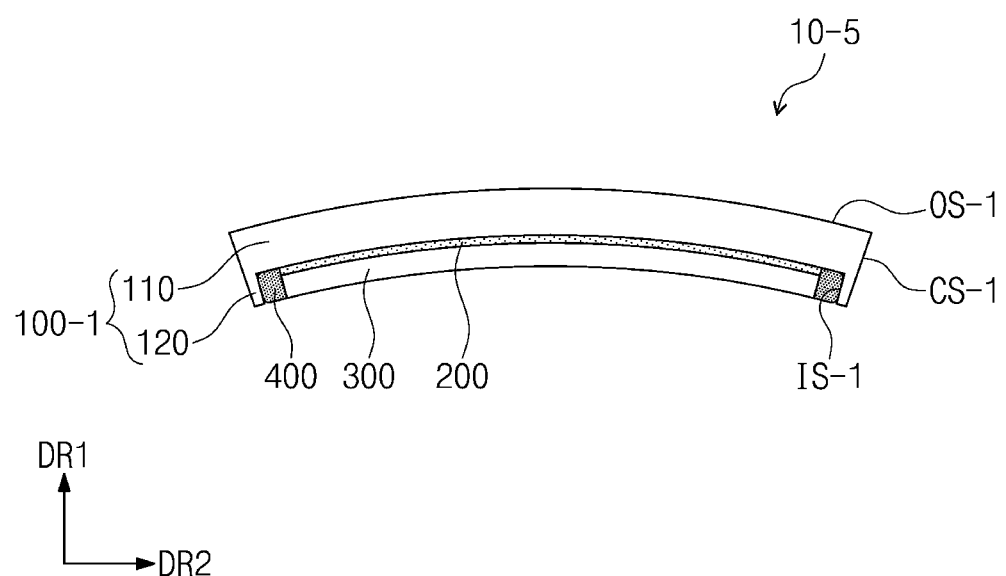

FIGS. 5A to 5C are cross-sectional views illustrating electronic device modules according to some embodiments of the inventive concept. Electronic device modules 10-3, 10-4, and 10-5 will be described with reference to FIGS. 5A to 5C. For concise description, an element previously described with reference to FIGS. 1, 2A, 2B, 3A, 3B, and 3C may be identified by a similar or same reference number without repeating an overlapping description thereof.

As shown in FIG. 5A, an electronic device 10-3 according to some embodiments may include a second coupling member 400-3 which is in contact with the inner surface IS and the connecting surface CS. The second coupling member 400-3 may be provided to cover the connecting surface CS and at least a portion of the inner surface IS.

The connecting surface CS may define an edge of the window member 100. For example, the second coupling member 400-3 may be provided to cover edges of each of the window member 100, the first coupling member 200, and the display member 300.

Since the second coupling member 400-3 covers the edge of the window member 100, the window member 100 may be protected from an external impact. That is, it may be possible to reduce a delamination failure from occurring in the electronic device 10-3 and to improve durability of the electronic device 10-3.

As shown in FIG. 5B, an electronic device 10-4 according to some embodiments may further include a third coupling member 500. The third coupling member 500 may be provided to be in contact with the second coupling member 400.

The third coupling member 500 may be provided to cover at least a portion of the second coupling member 400. In the present embodiment, the third coupling member 500 is illustrated to cover an outer surface of the second coupling member 400, but the inventive concept is not limited thereto. For example, the third coupling member 500 may cover a portion of the connecting surface CS of the window member 100 and/or a portion of a bottom surface of the display member 300, in addition to the outer surface of the second coupling member 400.

The third coupling member 500 may have an adhesive property. The third coupling member 500 may be an adhesive film or an adhesive resin. Since the electronic device 10-4 further includes the third coupling member 500, it may be possible to improve adhesion characteristics between the window member 100, the first coupling member 200, and the display member 300 and to improve durability of the electronic device 10-4.

In some embodiments, as shown in FIG. 5C, an electronic device 10-5 may include a window member 100-1 provided in various forms. For example, the window member 100-1 may include an upper portion 110 and a side portion 120.

The upper portion 110 may substantially correspond to the window member 100 shown in FIGS. 2A and 2B. Thus, the window member 100-1 may correspond to a structure including not only the window member 100 shown in FIGS. 2A and 2B, but also the side portion 120.

The side portion 120 may protrude from the upper portion 110. For example, the side portion 120 may protrude from the upper portion 110 in a downward direction, thereby defining an internal space, along with the upper portion 110. The first coupling member 200 and the display member 300 may be placed in the internal space.

An inner surface IS-1 may include a curved surface and a surface which is bent from the curved surface in the thickness direction. The inner surface IS-1 may be a surface substantially defining the internal space.

An outer surface OS-1 may include a curved surface. A connecting surface CS-1 may connect the inner surface IS-1 to the outer surface OS-1. The outer surface OS-1 may substantially correspond to the outer surface OS of FIGS. 2A and 2B.

A portion of the inner surface IS-1 may not be covered with the first coupling member 200, and the second coupling member 400 may be provided to cover at least a portion of the uncovered portion of the inner surface IS-1. Here, the second coupling member 400 may be provided between the edge of the display member 300 and the side portion 120.

In other words, the second coupling member 400 may be provided to fill a gap region between the first coupling member 200 and the side portion 120 and between the display member 300 and the side portion 120. Accordingly, an edge of the second coupling member 400 may be covered with the window member 100-1.

Since the electronic device 10-5 includes the window member 100-1 with the side portion 120, components, such as the display member 300, may be stably placed on the inner surface IS-1. In addition, since the second coupling member 400 is protected by the window member 100-1 having a relatively high strength, it may be stably protected from an external impact or contamination.

According to some embodiments of the inventive concept, an electronic device including a dome-shaped window member may be provided. It may be possible to suppress an interlayer delamination issue, which may occur between components coupled to a curved inner surface of the window member. Furthermore, it may be possible to stably protect internal components, which are provided in the dome-shaped window member, from an impact to be exerted on an edge region of the window member, and thus to improve durability of the electronic device.

While some example embodiments of the present inventive concepts have been particularly shown and described, it will be understood by one of ordinary skill in the art that variations in form and detail may be made therein without departing from the spirit and scope of the present inventive concepts as set forth in the attached claims.

What is claimed is:

1. An electronic device comprising:
    a window member having a dome shape which is convex in a first direction, and comprising an outer surface including a curved surface, an inner surface including a curved surface and facing the outer surface, and a connecting surface connecting the inner surface and the outer surface;
    a display member configured to display an image toward the inner surface, the display member comprising a curved surface;
    a first coupling member covering at least a portion of the inner surface, the first coupling member being disposed between the window member and the display member to couple the display member to the window member; and
    a second coupling member covering an edge of the display member and coupling the display member to the window member.

2. The electronic device of claim 1, wherein, when viewed in a plan view perpendicular to the first direction, the window member has a circular shape.

3. The electronic device of claim 2, wherein the connecting surface has a ring shape, when viewed in the plan view.

4. The electronic device of claim 1, wherein the second coupling member is disposed to cover at least a portion of the inner surface.

5. The electronic device of claim 4, wherein the second coupling member is disposed to cover the edge of the display member and an edge of the first coupling member.

6. The electronic device of claim 5, wherein the edge of the first coupling member and the edge of the display member are aligned with each other in a thickness direction.

7. The electronic device of claim 5, wherein the edge of the first coupling member and the edge of the display member are disposed to form a stepwise structure in a thickness direction, and
    the second coupling member is disposed to cover the stepwise structure.

8. The electronic device of claim 4, wherein a portion of the inner surface is covered with the first coupling member, and another portion of the inner surface is covered with the second coupling member.

9. The electronic device of claim 8, wherein the second coupling member has a closed-loop shape, when viewed in a plan view perpendicular to the first direction.

10. The electronic device of claim 4, wherein the second coupling member comprises a plurality of portions which are arranged along the edge of the display member and are spaced apart from each other, when viewed in a plan view perpendicular to the first direction.

11. The electronic device of claim 4, wherein the second coupling member comprises a plurality of portions which are arranged along the edge of the display member and are connected to each other, when viewed in a plan view perpendicular to the first direction.

12. The electronic device of claim 1, wherein the second coupling member comprises at least one of acrylic or silicone resins.

13. The electronic device of claim 1, wherein the second coupling member is disposed to cover the connecting surface of the window member.

14. The electronic device of claim 1, further comprising a third coupling member disposed on an edge of the second coupling member.

15. The electronic device of claim 14, wherein the third coupling member is disposed to enclose the edge of the second coupling member.

16. The electronic device of claim 14, wherein the second coupling member comprises an adhesive resin, and the third coupling member comprises an adhesive film.

17. The electronic device of claim 1, wherein the display member comprises:
 a display panel including a plurality of pixels;
 a touch panel on the display panel; and
 an optical panel on the display panel,
 wherein the second coupling member is disposed to cover an edge of the display panel, an edge of the touch panel, and an edge of the optical panel.

18. The electronic device of claim 1, wherein the window member comprises an upper portion and a side portion protruding from the upper portion,
 the upper portion and the side portion are connected to define an internal space,
 the first coupling member, the display member, and the second coupling member are disposed in the internal space, and
 the side portion is disposed to enclose an edge of the second coupling member.

* * * * *